United States Patent
Kunert et al.

(10) Patent No.: US 9,876,080 B2
(45) Date of Patent: Jan. 23, 2018

(54) STRAINED GROUP IV CHANNELS

(71) Applicant: IMEC VZW, Leuven (BE)

(72) Inventors: Bernardette Kunert, Wilsele (BE); Robert Langer, Leuven (BE); Geert Eneman, Balen (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/218,922

(22) Filed: Jul. 25, 2016

(65) Prior Publication Data
US 2017/0033183 A1 Feb. 2, 2017

(30) Foreign Application Priority Data

Jul. 31, 2015 (EP) .................... 15179239

(51) Int. Cl.
*H01L 21/02* (2006.01)
*H01L 29/10* (2006.01)
(Continued)

(52) U.S. Cl.
CPC .... *H01L 29/1054* (2013.01); *H01L 21/02455* (2013.01); *H01L 21/02469* (2013.01);
(Continued)

(58) Field of Classification Search
CPC ......... H01L 21/02455; H01L 21/02469; H01L 21/02513; H01L 21/02524;
(Continued)

(56) References Cited

U.S. PATENT DOCUMENTS 4,786,615 A * 11/1988 Liaw ................. H01L 21/02639
117/89
7,569,869 B2 8/2009 Jin et al.
(Continued)

FOREIGN PATENT DOCUMENTS

EP 2 897 161 A1 7/2015

OTHER PUBLICATIONS

Arimoto, Keisuke et al., "Gas-Source MBE Growth of Strain-Relaxed Si1-xCx on Si(100) Substrates", Journal of Crystal Growth, vol. 378, 2013, pp. 212-217.
(Continued)

*Primary Examiner* — Yosef Gebreyesus
(74) *Attorney, Agent, or Firm* — McDonnell Boehnen Hulbert & Berghoff LLP (57) ABSTRACT

Disclosed herein is a semiconductor structure including: (i) a monocrystalline substrate having a top surface, (ii) a non-crystalline structure overlying the monocrystalline substrate and including an opening having a width smaller than 10 microns and exposing part of the top surface of the monocrystalline substrate. The semiconductor structure also includes (iii) a buffer structure having a bottom surface abutting the part and a top surface having less than $10^8$ threading dislocations per $cm^2$, the buffer structure being made of a material having a first lattice constant. The semiconductor structure also includes (iv) one or more group IV monocrystalline structures abutting the buffer structure and that are made of a material having a second lattice constant, different from the first lattice constant.

18 Claims, 6 Drawing Sheets

(51) Int. Cl.
| | |
|---|---|
| *H01L 29/423* | (2006.01) |
| *H01L 29/04* | (2006.01) |
| *H01L 21/324* | (2006.01) |
| *H01L 21/306* | (2006.01) |
| *H01L 29/161* | (2006.01) |
| H01L 29/775 | (2006.01) |
| H01L 29/06 | (2006.01) |
| H01L 21/8238 | (2006.01) |

(52) U.S. Cl.
CPC .. *H01L 21/02513* (2013.01); *H01L 21/02524* (2013.01); *H01L 21/02532* (2013.01); *H01L 21/30612* (2013.01); *H01L 21/3245* (2013.01); *H01L 29/045* (2013.01); *H01L 29/161* (2013.01); *H01L 29/42356* (2013.01); H01L 21/02381 (2013.01); H01L 21/823807 (2013.01); H01L 21/823821 (2013.01); H01L 29/0673 (2013.01); H01L 29/775 (2013.01)

(58) Field of Classification Search
CPC ......... H01L 21/02532; H01L 21/30612; H01L 21/3245; H01L 29/1054; H01L 29/045; H01L 29/161; H01L 29/42356; H01L 29/0673; H01L 29/775; H01L 21/02381; H01L 21/823807; H01L 21/823821
See application file for complete search history.

(56) References Cited

U.S. PATENT DOCUMENTS

| | | | |
|---|---|---|---|
| 8,063,413 | B2 | 11/2011 | Bai et al. |
| 8,173,551 | B2 | 5/2012 | Bai et al. |
| 8,193,523 | B2 | 6/2012 | Pillarisetty et al. |
| 8,575,596 | B2 | 11/2013 | Pillarisetty et al. |
| 8,575,653 | B2 | 11/2013 | Rachmady et al. |
| 2004/0075105 | A1* | 4/2004 | Leitz ............... C30B 25/02 257/190 |
| 2009/0039361 | A1 | 2/2009 | Li et al. |
| 2010/0012972 | A1* | 1/2010 | Kouvetakis ........... C01B 6/06 257/183 |
| 2011/0086491 | A1 | 4/2011 | Ko et al. |
| 2013/0270512 | A1 | 10/2013 | Radosavljevic et al. |
| 2014/0138770 | A1* | 5/2014 | van Dal ......... H01L 29/66431 257/347 |
| 2014/0175378 | A1 | 6/2014 | Goel et al. |
| 2014/0264348 | A1* | 9/2014 | Tsai ............... C30B 25/165 257/57 |
| 2014/0264592 | A1 | 9/2014 | Oxland et al. |
| 2014/0374797 | A1 | 12/2014 | Kwon et al. |
| 2015/0364603 | A1* | 12/2015 | Cheng ............ H01L 29/7851 257/192 |

OTHER PUBLICATIONS

Beeler, R. T. et al., "Compositional Dependence of the Absorption Edge and Dark Currents in Ge1-x-y Si x Sn y /Ge (100) Photodetectors Grown Via Ultra-Low Temperature Epitaxy of Ge4H10, Si4H10, and SnD4", Applied Physics Letters, vol. 101, 2012, pp. 1-5.

Tiwari, Sandip et al., "Empirical Fit to Band Discontinuities and Barrier Heights in III-V Alloy Systems", Applied Physics Letters, vol. 60, No. 5, Feb. 3, 1992, pp. 630-632.

Geisz, J. F. et al., "III-N-V Semiconductors for Solar Photovoltaic Applications", Institute of Physics Publishing, Semiconductor Science and Technology, vol. 17, 2002, pp. 769-777.

European Search Report, European Patent Application No. 15179239.7, dated Jan. 15, 2016, 10 pages.

* cited by examiner

STRAINED GROUP IV CHANNELS

CROSS-REFERENCE TO RELATED APPLICATIONS

The present application is a non-provisional patent application claiming priority to European Patent Application No. EP 15179239.7 filed Jul. 31, 2015, the contents of which are hereby incorporated by reference.

FIELD OF THE DISCLOSURE

The present disclosure relates to the field of semiconductor manufacturing and more in particular to the growth of strained monocrystalline group IV structures suitable for use for instance as channels in field effect transistors.

BACKGROUND

The use of an underlying buffer is one of the most investigated stress techniques to grow strained silicon planar, fin-shaped or wire-shaped channels.

For silicon channels, generating a compressive strain in the direction from source to drain in the channel is beneficial for p-type Field Effect Transistors (p-FETs). However suitable underlying buffers are hard to find. One option is the use of a carbon-doped Si buffer as described in Arimoto, et al. (Journal of Crystal Growth, 378, 201, 212-217 (2013)), but this option comes with severe integration challenges. For instance, it is difficult to keep the carbon in a substitutional lattice position during processing and therefore to maintain the induced strain.

For germanium channels, generating a tensile strain in the direction from source to drain in the channel is beneficial for n-type FETs. Current investigations focus on the use of a SiGeSn buffer layer (Beller et al., Appl. Phys. Lett. 101, 221111 (2012)). The use of such a buffer layer is however very problematic because it suffers from a small band gap which leads to an inversed hetero-offset in the device, which has a negative impact on device performances.

Another issue with buffers of conventional devices is that it is very difficult to selectively remove the buffer after the group IV channel growth. This makes for instance the formation of Gate All Around (GAA) FETs particularly challenging.

There is therefore still a need in the art for alternative buffers for introducing strain in group IV semiconductor structures and which would not suffer from one or more of the drawbacks of conventional devices.

SUMMARY

It is an object of the present disclosure to provide methods for growing a strained group IV monocrystalline structure.

An attribute of embodiments of the present disclosure includes that a method permits to easily and selectively etch away the buffer used to induce the strain. This permits in some embodiments to obtain strained group IV monocrystalline materials free of contact with the buffer, and therefore having an additional surface (the surface that contacted the buffer) available for gating. This permits, for instance, to form a gate all around the group IV monocrystalline structure and therefore to form Gate All Around (GAA) FETs.

Another attribute of embodiments of the present disclosure include that a defect-poor group IV monocrystalline structure can be grown. This is achieved in some embodiments due to the low defect concentration achieved on the top surface of the buffer.

Another attribute of embodiments of the present disclosure includes that the strain induced in the group IV monocrystalline structure can be maintained during processing and can survive the removal of the buffer.

Another attribute of embodiments of the present disclosure includes that only a low amount of material is necessary to form the buffer and that the height of the buffer layer can be kept low.

Another attribute of embodiments of the present disclosure includes that a large band offset can be obtained between the buffer and the group IV monocrystalline structure, thereby reducing sub-threshold swing in FETs comprising the same.

The above objective is accomplished by a method and device according to the present disclosure.

In a first aspect, the present disclosure relates to a method, for forming a semiconductor structure, that may include epitaxially growing a III-V or II-VI buffer layer on a monocrystalline substrate and within a space (laterally) confined by non-crystalline sidewalls, where the space has a width smaller than 10 microns, where the material forming the surface of the III-V or II-VI buffer layer facing away from the monocrystalline substrate has a first relaxed lattice constant. The method may also include optionally annealing the buffer layer and optionally epitaxially growing on the buffer layer a III-V or II-VI monocrystalline interlayer. The method may further include epitaxially growing on the buffer layer at least one group IV monocrystalline structure made of a material having a second relaxed lattice constant different from the first relaxed lattice constant, where the optional interlayer is made of a material having a third relaxed lattice constant equal to the second relaxed lattice constant, and where the optional interlayer is thinner than a critical thickness at which a strain induced by the difference between the first and the third relaxed lattice constant is relaxed.

In a second aspect, the present disclosure relates to a semiconductor structure including: a monocrystalline substrate having a top surface, a non-crystalline structure overlying the monocrystalline substrate and comprising an opening having a width smaller than 10 microns and exposing part of the top surface of the monocrystalline substrate. The semiconductor structure may also include a buffer structure having a bottom surface abutting the part and a top surface having less than $10^8$ (e.g., less than $10^7$ or less than $10^6$) threading dislocations per $cm^2$, the buffer structure being made of a material having a first lattice constant. The semiconductor structure may also include an optional III-V or II-VI monocrystalline interlayer overlying the buffer structure. The semiconductor structure may also include at least one group IV monocrystalline structure abutting the optional interlayer if present or abutting the buffer structure and being made of a material having a second lattice constant, different from the first lattice constant, where the optional interlayer is made of a material having a third relaxed lattice constant equal to the second relaxed lattice constant, and where the optional interlayer is thinner than a critical thickness at which a strain induced by the difference between the first and the third relaxed lattice constant is relaxed.

Typically, the opening forms a space in which the buffer is confined. The buffer typically fills the opening.

Example embodiments are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

DETAILED DESCRIPTION

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosed embodiments.

Furthermore, the terms "first", "second", "third" and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms "top", "bottom", "over", "under" and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the example embodiments disclosed herein, the relevant components of the device may be A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments disclosed herein, various features of the exemplary embodiments are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the exemplary embodiments require more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the exemplary embodiment disclosed herein.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the present disclosure.

As used herein and unless provided otherwise, the term "semiconductor fin" relates to a semiconductor structure that protrudes from a substrate and whose length and height are greater than its width. In an example embodiment, this width is from 2 to 50 nm.

As used herein and unless provided otherwise, the term "nanowire" relates to a nanostructure having the shape of a rod, a ratio length/width of at least 2, a ratio length/width of at least 3, or a ratio length/width of at least 5, and a width of at most 30 nm, such as a width from 2 to 10 nm. The ratio width/height may be from 0.5 to 2 and is typically 1.

As used herein and unless provided otherwise, the term "nanosheet" relates to a nanostructure having the shape of a sheet and a thickness of from 2 to 20 nm. In an example embodiment the thickness may be from 3 to 10 nm.

As used herein and unless provided otherwise, the term "aspect ratio" of an element refers to the ratio height/width of the element (e.g. confined space or buffer), independently of its length.

As used herein, the term "height" relates to a dimension measured perpendicularly to the substrate while the terms "width" and "length" are measured parallel to the substrate and the "length" is larger or equal to the "width".

As used herein and unless provided otherwise, the term "group IV monocrystalline structure" relates to a monocrystalline structure made of one or more group IV elements. In semiconductor physics, Group IV elements are the elements C, Si, Ge, Sn, and Pb. In exemplary embodiments, the group IV elements may be selected from C, Si, Ge, and Sn. The group IV monocrystalline structure is typically made of Si and/or Ge, and optionally Sn or C wherein Si and Ge make up together at least 90 at % of the monocrystalline structure.

As used herein and unless provided otherwise, the term "III-V" when characterizing a material, refers to a material comprising 50 at % of at least one group-III (IUPAC group 13) element and 50 at % of at least one group-V element (IUPAC group 15). This includes binary compounds but also higher order compounds such as ternary compounds or compounds of up to 8 different elements selected in group III and group V.

When a lattice constant of a III-V material is referred to, it is the lattice constant of the zinc blende lattice.

As used herein and unless provided otherwise, the term "II-VI" when characterizing a material, refers to a material made of compounds comprising at least one group II (IUPAC group 2 and 12) element and at least one group VI element (IUPAC group 16). Examples are CdSe, CdS, CdTe, MgS, MgSe, MgTe, ZnO, ZnSe, ZnS and ZnTe. Aside from binary compounds, also higher order compounds such as ternary or even quaternary compounds are possible. Examples of ternary compounds are $Zn_xMg_{1-x}Se$ wherein x is from 1 to 0.7 and $MgSe_xS_{1-x}$ wherein x from 0.15 to 0.4. These two examples of ternary compounds can for instance be used to put Ge under tension.

As used herein and unless provided otherwise, the terms "hetero-offset" or "band offset" relates to the difference of energy between energy levels of two different materials. In particular, the term "valence band offset" will be used to characterize the difference of energy between the valence bands of two different materials. In the case of a compressively strained group IV material (e.g. used as a channel in a pFET), the valence band of the buffer may be below the valence band of the group IV material so that the holes may stay in the group IV material and not in the buffer material. The energy difference between the valence band of the group IV material and the valence band of the buffer material is the "valence band offset". In the case of a tensile strained group IV material (e.g. used as a channel in an nFET), the conduction band of the buffer may be above the conduction band of the group IV material so that the electrons may stay in the group IV material and not in the buffer material. The energy difference between the conduction band of the buffer material and the conduction band of the group IV material is the "conduction band offset".

As used herein and unless provided otherwise, the term "relaxed lattice constant" when referring to a material relates the intrinsic lattice constant of that material in absence of stress and at room temperature (e.g. at 300 K). Lattice constants are typically measure by X-ray diffraction. The lattice constants of the materials described herein can either be measured experimentally or can be found in the literature (see for instance Tiwari & Frank, Applied Physics Letters, 60 (1992) 630 or J. F. Geisz and D. J. Friedman, Semicond. Sci. Technol. 17 (2002) 769).

The "lattice mismatch" (f) of a material having a first relaxed lattice constant with a material having a second relaxed lattice constant is calculated with the formula $f=100\%*(\Delta a/a)$, wherein $\Delta a$ is the first lattice constant minus the second lattice constant, and wherein a is the second lattice constant.

Disclosed herein is a description of several exemplary embodiments. It is clear that other embodiments can be configured according to the knowledge of persons skilled in the art without departing from the technical teaching of the disclosure.

Reference will be made to transistors. These are three-terminal devices having a first main electrode such as a drain, a second main electrode such as a source and a control electrode such as a gate for controlling the flow of electrical charges between the first and second main electrodes.

In a first aspect, example embodiments relate to a method for forming a semiconductor structure comprising the steps of: a. epitaxially growing a III-V or II-VI buffer layer on a monocrystalline substrate and within a space confined (laterally) by non-crystalline sidewalls, the space having a width smaller than 10 microns, wherein the material forming the surface of the III-V or II-VI buffer layer facing away from to the monocrystalline substrate has a first relaxed lattice constant, b. optionally annealing the buffer layer during and/or after step a, and, c. optionally epitaxially growing on the buffer layer a III-V or II-VI monocrystalline interlayer, and d. epitaxially growing on the interlayer if present or on the buffer layer if the interlayer is not present, at least one group IV monocrystalline structure made of a material having a second relaxed lattice constant, different from the first relaxed lattice constant, where the optional interlayer is made of a material having a third relaxed lattice constant equal to the second relaxed lattice constant, and wherein the optional interlayer is thinner than a critical thickness at which a strain induced by the difference between the first and the third relaxed lattice constant is relaxed.

The buffer layer can be a single homogeneous layer, a single layer with a composition gradually changing from the bottom of the buffer layer (interface with the substrate) to the top of the buffer layer (surface facing away from the substrate), or a multilayer.

A difference between: the (first) relaxed lattice constant of the material forming the surface of the buffer layer facing away from the substrate, and the (second) relaxed lattice constant of the material forming the group IV monocrystalline structure, ensures that a strain will be present in the group IV monocrystalline structure. This is true when the group IV monocrystalline structure is grown epitaxially directly on the surface of the buffer layer. This remains true if a III-V or II-VI monocrystalline interlayer having a (third) relaxed lattice constant equal to the second relaxed lattice constant is grown between the buffer layer and the group IV monocrystalline structure provided that this interlayer is thinner than a critical thickness at which a strain induced by the difference between the first and the third relaxed lattice constant is relaxed.

In embodiments, step a may comprise the following steps: a1. epitaxially growing a III-V or II-VI buffer layer on a monocrystalline substrate and within a space confined (laterally) by non-crystalline side-walls, where the material forming the surface of the III-V or II-VI buffer layer facing away from the monocrystalline substrate has a first relaxed lattice constant; a2. etching a first and a second parallel trenches in the buffer layer; a3. filling the parallel trenches with a non-crystalline material; a4. optionally removing any of the non-crystalline material deposited in step a3 that is not in a trench (e.g. by performing a chemical-mechanical planarization); and a5. optionally forming a cavity by recessing the buffer layer, the cavity being delimited (laterally) by non-crystalline sidewalls and a buffer bottom. If no step a5 is performed, the group IV monocrystalline structure or the optional III-V or II-VI monocrystalline interlayer may be grown on top of the III-V or II-VI buffer layer.

In embodiments where no step c is performed, in step a5, the cavity may be recessed on a depth which is smaller, larger or equal to the height of the group IV monocrystalline structure to be grown.

In embodiments where step c is performed, step a5 may comprise forming a cavity by recessing the buffer layer on a depth which is smaller, larger or equal to the height of the combined interlayer and group IV semiconductor structure to be grown.

In embodiments, the interlayer optionally grown in step c may have a relaxed lattice constant within 0.1% of the relaxed lattice constant of the group IV monocrystalline structure grown in step d, and in an example, may have the same relaxed lattice constant as the group IV monocrystalline structure grown in step d.

In embodiments, the interlayer may have a thickness of from 1 to 50 nm, e.g. from 1 to 30 nm. This thickness range is typically lower than the critical thickness at which the strain induced by the lattice constant mismatch is relaxed.

The composition of the optional monocrystalline III-V or II-VI interlayer is not crucial as long as its relaxed lattice constant is within 0.1% of the relaxed lattice constant of the group IV monocrystalline structure grown in step d, and may be the same relaxed lattice constant as the group IV monocrystalline structure grown in step d. For this purpose, the person skilled in the art can adapt the compositions given for the material having the first relaxed lattice constant in any embodiment.

In embodiments, step d may comprise the steps: d1. epitaxially growing on the buffer layer or on the interlayer at least one group IV monocrystalline structure made of a material having a relaxed lattice constant different from the first relaxed lattice constant, and d2. exposing the sidewalls of the group IV monocrystalline structure by recessing the non-crystalline sidewall s.

In embodiments, the semiconductor structure may be an intermediate structure in the fabrication of a CMOS semiconductor device. The semiconductor structure of the first aspect may be a FET or an intermediate structure in the realization of a FET. The semiconductor structure may be a p-type FET, an n-type FET, a structure combining a p-type FET and an n-type FET or an intermediate structure in the realization of such structures. In embodiments, the semiconductor structure may be a Fin-based, a nanowire-based or a nanosheet-based FET or an intermediate structure in the realization thereof. In some embodiments, the semiconductor structure may be a GAA-FET such as a nanowire-based or a nanosheet-based GAA-FET. A FET is a transistor using an electric field to control the conductivity of a semiconductor channel toward one type of charge carrier. These are three-terminal devices having a first main electrode such as a drain, a second main electrode such as a source and a control electrode such as a gate for controlling the flow of electrical charges in a semiconductor channel situated between the first and second main electrodes.

A fin-based FET is a FET which channel is comprised in a semiconductor fin. A nanowire-based FET is a FET which channel is comprised in a semiconductor nanowire. A nanosheet-based FET is a FET which channel is comprised in a semiconductor nanosheet. A GAA-FET is a FET wherein the gate surrounds the channel region on all sides.

Typically, the channel region in a FET is a region of a semiconductor structure (e.g. a fin, a nanowire or a nanosheet) not comprising the lengthwise extremities thereof since the extremities are typically comprised in the source and the drain region of the semiconductor structure.

An example embodiment, may relate to a FET as described in any embodiments above, comprising a semiconductor structure according to any embodiment of the first aspect, which channel is formed by the group IV monocrystalline structure having the second relaxed lattice constant or which channel is grown on this group IV monocrystalline structure having the second relaxed lattice constant.

The monocrystalline substrate can be any monocrystalline substrate but may be a semiconductor substrate and it will typically be a Si substrate since it is the current standard in semiconductor manufacture.

The space confined by non-crystalline sidewalls, i.e. the confined space, may have a width smaller than 5 microns. A small width for the confined space may be advantageous as it permits to better trap defects at its non-crystalline sidewalls during the epitaxial growth of the buffer layer and/or during an optional annealing step. When the buffer layer grows epitaxially on the monocrystalline substrate, threading dislocations forms. These dislocations are typically not parallel to the non-crystalline sidewalls and will therefore rapidly end up at the non-crystalline sidewalls and be trapped thereon. The smaller the width of the confined space, the lower the epitaxial growth height necessary to achieve a threading dislocation-poor buffer top surface.

In embodiments, the width of the confined space may be smaller than 5 microns. In an example, the width may be smaller than 1 micron. In another example, the width may be smaller than 500 nm. In yet another example, the width may be smaller than 200 nm. In yet a further example, the width may be 10 nm or less. Such very narrow confined spaces may provide effective trapping of the defects at the non-crystalline side-walls of the confined space within a growth height which is compatible with the dimensions of current and future semiconductor technologies. Using a confined space having an aspect ratio sufficient for trapping substantially all threading dislocations at the non-crystalline (e.g. dielectric) sidewalls of the confined space is called aspect-ratio trapping (ART). In ART, the sidewalls are sufficiently high relative to the width of the growth area so as to trap most, if not all, of the defects. Another influential parameter for obtaining a buffer layer having a top surface with a low threading dislocation density is therefore the aspect ratio of the confined space. Indeed, higher aspect ratio may provide lower defect density at the top surface of the buffer if the buffer completely fills the confined space. Therefore, in example embodiments, the confined space may have an aspect ratio above 1, or may have an aspect ratio above 1.42. Other examples include an aspect ratio above 2, an aspect ratio above 3, and an aspect ratio above 5.

In embodiments, the non-crystalline sidewall may be a dielectric sidewall (e.g. SiO$_2$ sidewalls). The confined space may be defined in a non-crystalline (e.g. dielectric) material disposed over the top surface of the substrate. The buffer is epitaxially grown in the confined space.

In embodiments, the monocrystalline substrate has facets defined therein, prior to epitaxial growth. This promotes trapping of defects.

In embodiments, the base of the confined space does not simply consist in a flat horizontal surface of the substrate contacting the sidewalls but this base comprises two opposite surfaces made of the material of the substrate (e.g. carved in the substrate) and contacting corresponding opposite non-crystalline side walls at an angle beta from 100° to 170° (and more typically 90°+alpha, e.g. 144.8°, see below). These two monocrystalline surfaces may run along the length of the confined space. They may contact each other by meeting in a line inter-distant to both opposite sidewalls or they may be connected by a flat horizontal surface of the substrate.

In embodiments, the bottom of the confined space may have a v-shape. The angle between each of both the opposite surface and the main plane of the substrate is alpha. In the typical case wherein the opposite surfaces are each along a plane having Miller index [111], and wherein the main surface of the Si substrate is along a plane having Miller index [100], alpha is 54.8°. The angle between both opposite surfaces (e.g. the angle of the "v") may be equal to 180°-2*alpha, i.e. 70.4°. Alpha and beta are defined in FIG. 3.

In embodiments, the height of the buffer layer may be selected within the range 0.05 μm to 5 μm. In an example embodiment, this height may be less than 1 μm, and in another embodiment may be less than 0.5 μm.

To perform annealing during step a, an option is to grow a portion of the III-V structure, anneal, then grow a further portion, then anneal again. This process can be repeated one or more times. Annealing performed during or after step a may be advantageous when the confined space has a ratio height/width smaller than 1.42.

Such an annealing may cause some remaining threading dislocations to migrate toward the sidewalls where they will be trapped, thereby decreasing the threading dislocation density of the III-V or II-VI buffer top surface. This annealing step can typically be dispensed of for confined spaces having an aspect ratio of 1.42 or more, or 2 or more.

The annealing temperature may be in the baking range 500-750° C. and more typically in the baking range 550-650° C. A single annealing step can be performed constantly within that baking range (e.g. at a constant temperature within that baking range) or can be performed by cycling the temperature one or more times between a temperature lower than that baking range and a temperature within that baking range. A temperature lower than that baking range could be for instance a temperature of from 350° C. to 450° C.

If cycling is performed, the number of cycles can be up to 15 and is typically from 2 to 8 (e.g. 5 cycles). In an example embodiment, the annealing time within the backing range per cycle may be from 1 s to 10 min, and in another example embodiment may be from 1 min to 5 min. In an example embodiment, the total annealing time within the baking range may be from 2 s to 2 hours.

The shape of the top surface of the confined space will determine the shape of the top surface of the buffer layer since the top surface of the buffer layer will have the same width and at maximum the same length as the top surface of the confined space. The shape of the top surface of the buffer layer will itself constraint the shape of the group IV monocrystalline structure since its length will at most correspond to the length of the top surface of the buffer layer while its width will be smaller, equal or at most 5% broader than the top surface of the buffer layer. In an example embodiment with a single group IV monocrystalline structure grown on the buffer layer, the width and the length of the group IV monocrystalline structure may be the same as the width and the length of the top surface of the buffer layer. In embodiments, the width may be up to 5% broader. In cases where more than one group IV monocrystalline structure is grown on the buffer layer, the length of each group IV monocrystalline structure may be equal to or smaller than the length of the top surface of the buffer layer while the width of each group IV monocrystalline structure may be equal, smaller or larger than the width of the top surface of the buffer layer.

The confined space may have the shape of a trench. This trench may be a hole which is longer than high and longer than wide. In embodiments, the bottom of the trench may have a v-shape.

Having the confined space in the shape of a trench may provide a top surface for the buffer layer which is longer than wide. This in turn permits to grow one or more group IV monocrystalline structures shaped as nanowire or nanosheet wherein the length of the nanowire or nanosheet may for instance be equal to the length of the top surface of the buffer layer.

In embodiments, the group IV monocrystalline structure may be either a structure comprising a channel or an intermediate layer on which a structure comprising a channel is epitaxially grown.

The second relaxed lattice constant may be higher or lower than the first relaxed lattice constant in function of whether the epitaxial growth of a compressively strained group IV monocrystalline structure or of a tensile strained group IV monocrystalline structure is performed, respectively.

In embodiments, the lattice mismatch of the material with first relaxed lattice constant with the material having the second relaxed lattice constant may be from −0.1% to −3%. This induces a 0.1 to 3% compressive strain in the material with the second relaxed lattice constant.

In embodiments, the lattice mismatch of the material with first relaxed lattice constant with the material having the second relaxed lattice constant may be from 0.1% to 3%. This induces a 0.1 to 3% tensile strain in the material with the second relaxed lattice constant.

In some embodiments, a group IV material having a higher second relaxed lattice constant than the first relaxed lattice constant may for instance be selected from $Si_{1-y}Ge_y$, wherein y is from 0 to 1 (e.g. Si, Ge or a combination thereof) or $Si_{1-y-z}Ge_ySn_z$ where y is from 0 to 1 and where z is from 0 to 0.10, and in an embodiment may be from 0.01 to 0.10, wherein y+z=1.

In an example embodiment, it is $Si_{1-y}Ge_y$, wherein y is from 0.01 to 0.9, and in another example embodiment, it may be Si or Ge.

In an example embodiment, a group IV material having a lower relaxed lattice constant than the first lattice constant may for instance be selected from Si:C with up to 10% C or may be selected from $Si_{1-y}Ge_y$ with y being from 0 to 0.5 (e.g. Si).

In embodiments, the group IV monocrystalline structure can be an intermediate layer made of $Si_{1-x}Ge_x$ and a structure comprising a channel may be epitaxially grown thereon.

Such an intermediate layer can reduce inter-diffusion between the buffer layer and e.g. a Si or Ge structure. Another attribute of such an intermediate layer is that it can improve the conduction band offset.

In an example embodiment, such an intermediate layer may have a thickness (i.e. a height) of from 2 to 20 nm, and in another example embodiment, the thickness of the intermediate layer may be from 5 to 10 nm.

In embodiments, the group IV material can be made of $Si_{1-x}Ge_x$ wherein x is from 0.01 to 0.5 or from 0.01 to 0.4. In this last embodiment, the $Si_{1-x}Ge_x$ wherein x is from 0.01 to 0.4 may be an intermediate layer between the buffer layer and a Si structure (this Si structure can for instance be a structure comprising a channel, for instance a fin, a nanowire or a nanosheet comprising a channel).

In embodiments, the group IV monocrystalline structure may have two extremities along its longitudinal directions and the monocrystalline structure may be secured to the substrate by having these two extremities attached to the substrate by an entity not being etched during step d. This may be advantageous as it prevents that the removal of the buffer layer and/or the optional interlayer from the at least one group IV monocrystalline structure permits the relaxation of the strain induced in the group IV monocrystalline structure. This strain is therefore maintained in the released group IV monocrystalline structure. This entity may for instance be the non-crystalline sidewalls.

In embodiments, one extremity may be attached to a source contact and another extremity may be attached to a drain contact (the source contact and the drain contact being indirectly attached to the substrate). This is a practical way to attach the extremities of the group IV monocrystalline structure to the substrate.

In embodiments, the grown group IV monocrystalline structure may have the shape of a fin, a nanowire or a nanosheet. This fin, nanowire or nanosheet may comprise a channel.

In embodiments, the material having the first relaxed lattice constant (e.g. the material of the surface of the buffer layer facing away from the substrate) may be made of a III-V material comprising 50 at % of one or more III elements selected from the group consisting of Ga, B, Al, In, and Th and comprising one or more V elements selected from the group consisting of N, As, P, Sb, and Bi.

In embodiments, the material having the first relaxed lattice constant (e.g. the material of the surface of the buffer layer facing away from the substrate) may be made of: Ga and/or Al, and optionally one or more of In and B as group III elements, and one or more of P, N, Sb and As as group V elements. In this embodiment, B and N may be but not obligatorily mutually exclusive.

In embodiments, the material having the first relaxed lattice constant (e.g. the material of the surface of the buffer layer facing away from the substrate) may be made of: Ga, P, and B and/or N, wherein B and N may be but not obligatorily mutually exclusive. This embodiment is may be advantageous to induce compressive strain in a Si monocrystalline structure.

In embodiments, the material having the first relaxed lattice constant (e.g. the material of the surface of the buffer layer facing away from the substrate) may be made of a III-V material comprising Ga and optionally B and/or In as group III element, P and optionally N and/or As as group V element, wherein B and N are may be mutually exclusive, and As and In are mutually exclusive. Examples are $B_xGa_{1-x}P$ with x from 0 to 1, $B_xGa_{1-x}As_yP_{1-y}$ with x from 0 to 1 and y from 0 to 1, $GaN_yP_{1-y}$ wherein y is from 0 to 1, $GaN_xAs_yP_{1-x-y}$ wherein x is from 0 to 1, y is from 0 to 1 and x+y is smaller or equal to 1, $Ga_xIn_{1-x}N_yP_{1-y}$ wherein x is from 0 to 1 and y is from 0 to 1, and $B_xGa_yIn_{1-x-y}P$ wherein x is from 0 to 1, y is from 0 to 1 and x+y is smaller or equal to 1. This embodiment is particularly suited when the group IV monocrystalline structure may be compressively strained and when the group IV monocrystalline structure may be made of $Si_{1-x}Ge_x$ wherein x is from 0 to 0.49 (e.g. from 0 to 0.4), for instance when the group IV monocrystalline structure is Si.

In embodiments, and particularly when the group IV monocrystalline structure may be tensile strained and when the group IV monocrystalline structure may be made of $Si_{1-x}Ge_x$ wherein x is from 0.51 to 1 (e.g. from 0.6 to 1), for instance when the group IV monocrystalline structure is Ge, the material having the first relaxed lattice constant (e.g. the material of the surface of the buffer layer facing away from the substrate) may be made of a III-V material comprising Ga and/or In, and optionally Al as group III elements, and one or more of P, Sb, As, and N as group V elements. In an example, in this last embodiment, when N is used, As is used as well and P and Sb are not used.

When the group IV monocrystalline structure is tensile strained and is made of $Si_{1-x}Ge_x$ wherein x is from 0.51 to 1 (e.g. from 0.6 to 1), e.g. when the group IV monocrystalline structure is tensile strained Ge, the material having the first relaxed lattice constant may be selected from $In_xGa_{1-x}As$ wherein x is form 0.05 to 30, $In_xGa_{1-x}P$ wherein x is from 0.52 to 0.80, $GaSb_xAs_{1-x}$ wherein x is form 0.05 to 0.30, and $GaSb_xP_{1-x}$ wherein x is from 0.35 to 0.55. Optionally, these embodiments may further comprise N and/or B. These embodiments permit to induce tensile strain in the group IV monocrystalline structure. They also have the attribute of providing a good hetero-offset. In particular, their hetero-offset is better than with SiGeSn buffers.

In embodiments, when the group IV monocrystalline structure is made of $Si_{1-x}Ge_x$ wherein x is from 0.51 to 1 (e.g. from 0.6 to 1) or when the group IV monocrystalline structure is Ge, an intermediate Si rich layer can be present between the group IV monocrystalline structure and the buffer layer. The intermediate Si-rich layer can be a layer comprising 51 at % or more Si such as for instance a Si layer or a $Si_{1-x}Ge_x$ layer wherein x is from 0 to 0.49 (e.g. from 0 to 0.4). Such an intermediate layer may reduce inter-diffusion between the group IV monocrystalline structure and the barrier layer.

In any embodiment, the buffer layer may be made of a single material, a multilayer of different materials or a material which composition gradually varies along the height of the buffer layer. In any case, it is the top layer of the buffer layer which must be made of a material having the first relaxed lattice constant. This may in some embodiments mean that the buffer layer is entirely made of the material having the first relaxed lattice constant; in other embodiments that it is the top layer of a multilayer buffer which is made of the material having the first relaxed lattice constant; in yet other materials that the composition of the buffer varies from the bottom of the buffer to the top of the buffer to arrive with a material having the first lattice constant at the upper surface of the buffer layer.

When the group IV monocrystalline structure is tensile strained and is made of $Si_{1-x}Ge_x$ wherein x is from 0.51 to 1 (e.g. from 0.6 to 1), e.g. when the group IV monocrystalline structure is tensile strained Ge, a buffer layer may be made of a (In)GaAs material where the concentration in In varies from 0% at the bottom of the buffer (e.g. at the interface with the substrate) to from 10 to 30% at the top surface of the buffer. The top layer defines the first relaxed lattice constant and the lattice mismatch towards the group IV monocrystalline structure.

When the group IV monocrystalline structure is tensile strained and is made of $Si_{1-x}Ge_x$ wherein x is from 0.51 to 1 (e.g. from 0.6 to 1), e.g. when the group IV monocrystalline structure is tensile strained Ge, another buffer may be made of a $GaSb_xP_{1-x}$ material where x varies from 0 at the bottom of the buffer (e.g. at the interface with the substrate) to from 0.35 to 0.55 at the top surface of the buffer.

When the group IV monocrystalline structure is compressively strained and is made of $Si_{1-x}Ge_x$ wherein x is from 0.51 to 1 (e.g. from 0.6 to 1), e.g. when the group IV monocrystalline structure is compressively strained Ge, the material having the first relaxed lattice constant may be $GaP_xAs_{1-x}$ with x being form 0.7 to 1; $GaP_xSb_{1-x}$ with x being from 0.7 to 1, $B_yGa_{1-y}P_xAs_{1-x}$ with y being from 0.07 to 0 and x from 1 to 0, $GaN_yP_xAs_{1-x-y}$: wherein y is from 0.07 to 0 and x from 1 to 0. Alternatives for the buffer may be ByGa1-yPxSb1-x, GaNyPxSb1-x-y, or ByGa1-y-xInxAs.

These embodiments may introduce compressive strain in these group IV monocrystalline structures.

In embodiments, the buffer layer may be made of a II-VI material. For instance it can be made of MgS. Of course, ternary and quaternary II-VI materials are suitable as well.

The material forming the top of the III-V or II-VI buffer layer has a first relaxed lattice constant different from the second relaxed lattice constant.

In embodiments, if a compressively strained group IV monocrystalline structure is wished, the first relaxed lattice constant must be smaller than the second relaxed lattice constant. When such a group IV monocrystalline structure is used as a channel for a pFET, such a compressive stress increases the performances of the transistor by improving the current density through the channel.

Also in the case of a Ge monocrystalline structure, an intermediate layer may be provided between the barrier layer and the group IV monocrystalline structure. This intermediate layer may for instance be a $Si_{1-x}Ge_x$ wherein x is from 0.3 to 0.95 (e.g. 0.5 to 0.95) or a group III-V intermediate layer and may serve as a quantum barrier to improve the hetero offset toward the Ge channel. If the intermediate layer is a group III-V intermediate layer, it is considered as forming the top surface of the barrier layer and therefore as defining the first relaxed lattice constant.

In embodiments, the method may further comprise after step d, the step h of removing the buffer layer from the monocrystalline structure by selectively etching away at least (the) part of the buffer layer contacting the monocrystalline structure.

Etching chemistries permitting to etch a group III-V or a group II-VI material selectively with respect to a group IV material are known to the person skilled in the art. For instance, mixtures consisting of HCl, $H_2O_2$, and $H_2O$ are known to etch III-V materials (such as GaAs, InP or GaAsP) selectively toward a group IV material such as Si.

As used herein, "removing" the buffer layer from the monocrystalline structure means suppressing physical contact between the buffer layer and the monocrystalline structure. This is achieved by etching away selectively, i.e. without substantially etching the monocrystalline structure, at least (the) part of the buffer layer contacting the monocrystalline structure.

By removing the buffer layer from the monocrystalline structure, the surface of the monocrystalline structure that was previously in contact with the buffer layer is now exposed. This may be advantageous as it permits in a later step to cover this surface with a gate structure. For instance, a gate structure completely surrounding the monocrystalline structure may be formed. This may be advantageous because if the monocrystalline structure is used as a channel in a FET, the channel can be present all around the monocrystalline structure and the current through the channel can be controlled by all sides.

In embodiments, the method may therefore further comprise the step e of forming a gate structure covering the surface.

In embodiments, the method may further comprise after step d the steps of: e. epitaxially growing a further buffer layer made of a material having a fourth relaxed lattice constant and being such that it can be etched selectively with respect to the material having a fifth lattice constant, f. epitaxially growing one or more further group IV monocrystalline structures made of a material having a fifth relaxed lattice constant, and g. selectively etching away the further buffer layer thereby exposing at least part of a surface of the one or more further group IV monocrystalline structure.

Consecutive steps e and f may be repeated one or more times in order to form additional group IV monocrystalline structures spaced vertically. Steps e and f permit to form several group IV monocrystalline structures spaced vertically. In an example embodiment, each of these monocrystalline structures may be a nanosheet. During step e and/or between step e and f, an annealing step may be performed to reduce defect density.

In an example embodiment, each of these monocrystalline structures may be secured to the substrate by entities not being etched during step g. These entities may for instance be the non-crystalline sidewalls.

In an example embodiment, each of these monocrystalline structures may have two extremities along their longitudinal directions and they may be secured to the substrate by having these two extremities attached to the substrate by an entity not being etched during step g. This may be advantageous as it prevents the relaxation of the strain induced in the group IV monocrystalline structures.

In embodiments, for each group IV monocrystalline structure, one extremity may be attached to the substrate via attachment to a source contact and another extremity may be attached to the substrate via attachment to a drain contact. This is a practical way to attach the extremities of the group IV monocrystalline structure to the substrate.

In embodiments, step d and/or step f may be performed at a temperature of from 250° C. to 550° C. and in other embodiments may be performed at a temperature of from 300° C. to 500° C. Such a low growth temperature may reduce diffusion of the buffer material into the group IV material.

In embodiments, step d and/or step f may be performed in such a way that the monocrystalline group IV material grows at a speed of from 0.005 nm/s to 5 nm/s, and in other embodiments may be performed in such a way that the monocrystalline group IV material grows at a speed of from 0.01 to 1 nm/s.

In embodiments, step f may comprise epitaxially growing on the buffer layer: a first monocrystalline structure made of a group IV material having a higher relaxed lattice constant than the first lattice constant, and a second monocrystalline structure made of a group IV material having a lower relaxed lattice constant than the first lattice constant. This way, a first compressively strained monocrystalline structure and a second tensile strained monocrystalline structure are provided on a same buffer.

This embodiment may simplify CMOS integration by requiring the growth of only one buffer layer for obtaining and integrating both a compressively strained pFET and a tensile strained nFET. The pFET and the nFET can be obtained by providing each monocrystalline structure made of a group IV material with a source, a drain and a gate structure. Of course, corresponding source, drain and gate contacts can be provided as well.

In embodiments wherein a first compressively strained monocrystalline structure and a second tensile strained monocrystalline structure are provided on a same buffer, the material having the first or the fourth relaxed lattice constant (e.g. the buffer) may for instance be a ternary composition such as a $GaP_{1-x}As_x$ material with from 0 to 90% As, a GaPSb material with from 0 to 25% Sb, a GaInP material with from 0 to 40% In, a AlPSb material with 0 to 25% Sb, a AlPAs material with 0 to 90% As), or a AlInP material with 0 to 40% In. Other suitable ternary buffer compositions comprise $B_{1-x}Ga_xAs$ and $Ga_{1-x}N_xAs$. Examples of suitable quaternary buffer compositions are $Ga_{1-x}Al_xP_{1-y}As_y$, $Ga_{1-x}In_xP_{1-y}As_y$, $Ga_{1-x}Al_xP_{1-y}Sb_y$, $Ga_{1-x}In_xP_{1-y}Sb_y$, $In_{1-x}Al_xP_{1-y}As_y$, $In_{1-x}Al_xP_{1-y}Sb_y$, $Ga_{1-y}N_yAs_{1-x}y$-xPy, $B_{1-x}Ga_xAs_{1-y}Sb_y$, $Ga_{1-x}N_xAs_{1-y-x}Sb_y$, $B_{1-x}Ga_xAs_{1-y}P_y$, $GaP_xAs_{1-y-x}Sb_y$, and $B_yGa_xIn_{1-y-x}P$. The material having the first or the fourth relaxed lattice constant (e.g. the buffer) may also be a II-VI material such as e.g. $ZnS_xSe_{1-x}$ with x from 0.2 to 0.8 or $Zn_xMg_{1-x}S$ with x from 0 to 0.8

Amongst these materials, $GaP_{1-x}As_x$ may provide the simplest approach as it may be easy to grow over the whole composition range.

In embodiments for the forming of a semiconductor structure including a compressively strained group IV monocrystalline structure and a tensile strained group IV monocrystalline structure sharing a same buffer layer, the method may include a1. epitaxially growing a III-V or II-VI buffer layer on a monocrystalline substrate and within a space confined by non-crystalline sidewalls, the space having a width of from 1 to 10 microns, where the material forming the surface of the III-V or II-VI buffer layer facing away from the monocrystalline substrate has a first relaxed lattice constant. The method may also include a2. etching at least three parallel trenches in the buffer layer. The method may further include a3. filling the trenches with a non-crystalline material thereby forming at least three parallel non-crystalline walls. The method may yet further include a4. optionally removing any of the non-crystalline material deposited in step a3 that is not in a trench (e.g. using a technique such as chemical-mechanical planarization).

The method may additionally include a5. optionally forming at least a first and a second cavity by recessing the buffer layer present between the parallel non-crystalline sidewalls (e.g. on a depth corresponding to the height of the group IV semiconductor structure to be grown), each of the cavity being delimited by a pair of the parallel non-crystalline sidewalls and a buffer bottom. The method may also include b. annealing the buffer layer at any time during step a1 and/or after step a1 and before d1. Further, the method may include c. optionally epitaxially growing on the buffer layer a III-V or II-VI interlayer (e.g. as defined in the first aspect). Yet further, the method may include d1. epitaxially growing on the buffer layer or on the interlayer at least one group IV monocrystalline structure made of a material having a relaxed lattice constant higher than the first relaxed lattice constant. Yet further, the method may include d2. epitaxially growing on the buffer layer or on the interlayer at least one group IV monocrystalline structure made of a material having a relaxed lattice constant lower than the first relaxed lattice constant. The method may also include d3. exposing the sidewalls of the group IV monocrystalline structures by recessing the non-crystalline sidewalls.

In embodiments for the forming of a semiconductor structure including a compressively strained group IV monocrystalline structure and a tensile strained group IV monocrystalline structure sharing a same buffer layer, the method may include a1. epitaxially growing a III-V or II-VI buffer layer on a monocrystalline substrate and within a space confined by a first and a second parallel non-crystalline sidewalls, the space having a width of from 1 to 10 microns, where the material forming the surface of the III-V or II-VI buffer layer facing away from the monocrystalline substrate has a first relaxed lattice constant. The method may also include a2. etching at least one trench in the buffer layer between the first and the second non-crystalline sidewalls and parallel therewith. The method may further include a3. filling the at least one trench with a non-crystalline material thereby forming at least a further non-crystalline sidewall.

The method may yet further include a4. optionally removing any of the non-crystalline material deposited in step a3 that is not in a trench (e.g. using a technique such as chemical-mechanical planarization). The method may additionally include a5. optionally forming at least a first and a second cavity by recessing the buffer layer present between the parallel non-crystalline sidewalls on a depth corresponding to the height of the group IV semiconductor structure to be grown, each of the cavity being delimited by a pair of the parallel non-crystalline sidewalls and a buffer bottom. The method may also include b. annealing the buffer layer at any time during step a1 and/or after step a1 and before step d1. The method may also include c. optionally epitaxially growing on the buffer layer a III-V or II-VI interlayer (e.g. as defined in the first aspect). The method may also include d1. epitaxially growing on the buffer layer or on the interlayer at least one group IV monocrystalline structure made of a material having a relaxed lattice constant higher than the first relaxed lattice constant. The method may also include d2. epitaxially growing on the buffer layer or on the interlayer at least one group IV monocrystalline structure made of a material having a relaxed lattice constant lower than the first relaxed lattice constant. The method may also include d3. exposing the sidewalls of the group IV monocrystalline structures by recessing the non-crystalline sidewalls.

In a second aspect, exemplary embodiments relate to a semiconductor structure obtainable by any embodiment of the method of the first aspect.

In an embodiment of the second aspect, the exemplary embodiments relate to a semiconductor structure including: a monocrystalline substrate having a top surface, a non-crystalline structure overlying the monocrystalline substrate and comprising an opening having a width smaller than 10 microns and exposing part of the top surface of the monocrystalline substrate, a buffer structure having a bottom surface abutting the part and a top surface having less than $10^8$ (e.g., less than $10^7$ or less than $10^6$) threading dislocations per $cm^2$, the buffer structure being made of a material having a first lattice constant, an optional III-V or II-VI monocrystalline interlayer overlying the buffer structure, and at least one group IV monocrystalline structure abutting the optional monocrystalline interlayer if present or abutting the buffer structure and being made of a material having a second lattice constant, different from the first lattice constant, where the optional interlayer is made of a material having a third relaxed lattice constant equal to the second relaxed lattice constant, and where the optional interlayer is thinner than a critical thickness at which a strain induced by the difference between the first and the third relaxed lattice constant is relaxed.

In embodiments, the semiconductor structure, the monocrystalline substrate, the material having a first lattice constant, the material having a second lattice constant, the interlayer, and the group IV monocrystalline structures, may independently be according to any embodiment of the first aspect.

In embodiments, the opening of the non-crystalline structure may form a space confined by non-crystalline sidewalls as defined in any embodiments of the first aspect.

The above and other characteristics, features and attributes of the exemplary embodiments will become apparent from the following detailed description, taken in conjunction with the accompanying drawings, which illustrate, by way of example, the principles of the exemplary embodiments. This description is given for the sake of example only, without limiting the scope of the exemplary embodiments. The reference figures quoted below refer to the attached drawings.

Figure 1:
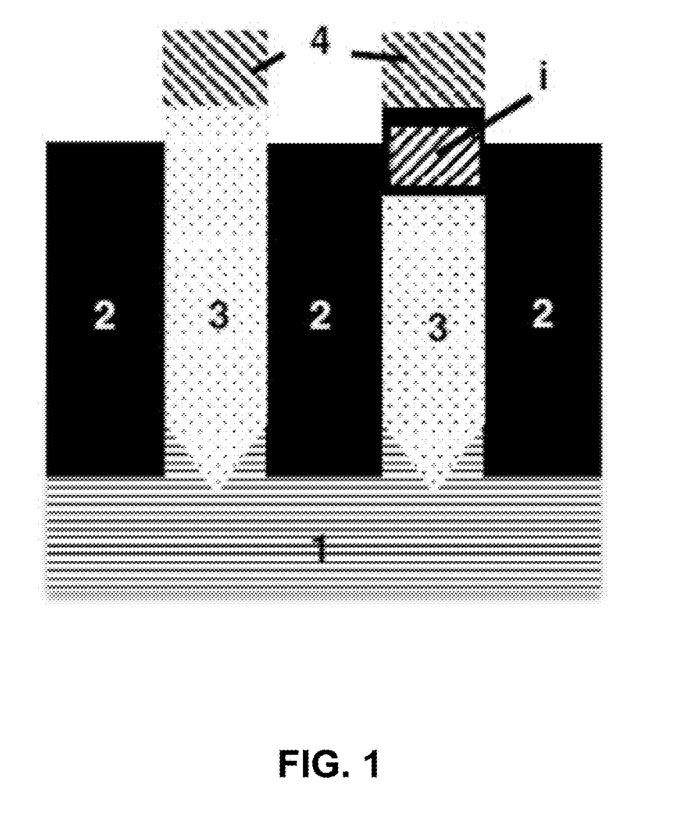
FIG. 1 is a vertical cross-section of a schematic representation of a semiconductor structure, according to an exemplary embodiment.

FIG. 1 shows a semiconductor structure, according to an exemplary embodiment. On the bottom of FIG. 1, a monocrystalline substrate (1) is shown.

On the left side of the semiconductor structure, a first confined space defined by a bottom surface belonging to the top surface of the monocrystalline substrate (1) and by non-crystalline sidewalls (2) is arranged on the substrate (1). The base of the confined space is optionally and as depicted here not a flat surface of the substrate (1) but has a v-shape, i.e. it forms a trench formed of two surfaces at an angle with the non-crystalline sidewalls (2), running along the length of the confined space, and meeting in a line inter-distant to both sidewalls (2). The confined space may for instance be a trench and the view of FIG. 1 may be a cross-section perpendicular to the longitudinal extent of that trench. A buffer layer (3) is depicted within the confined space. On top of the buffer layer (3), a group IV monocrystalline structure (4) (e.g. a compressively strained or tensile strained structure) is present. The structure can for instance be a nanowire.

On the right side of the semiconductor structure, a second confined space is depicted. It is defined in the same way as the first confined space and it also contains a buffer layer (3). An intermediate layer (i) is present between the buffer layer (3) and the group IV monocrystalline structure (4). The intermediate layer (i) reduces inter-diffusion between the buffer (3) and the group IV monocrystalline structure (4). Such inter-diffusion may be avoided because it leads to undesired doping of the group IV monocrystalline structure (4). The intermediate layer (i) may also provide sufficient valence band offset. The intermediate layer (i) may be a III-V material having a first relaxed lattice constant different from the relaxed lattice constant of the group IV material, in which case the intermediate layer forms the upper part of the buffer layer (3).

The intermediate layer (i) may be a III-V material having a relaxed lattice constant equal to the relaxed lattice constant of the group IV material, in which case the intermediate layer is an interlayer which must have a thickness lower than the thickness at which the strain induced by the lattice constant mismatch is relaxed at the top of the intermediate layer.

The intermediate layer (i) may be a group IV material in which case it forms the lower part of the group IV monocrystalline structure (4).

Both confined spaces (left and right) do not have to be present together in the semiconductor structure. They simply represent two examples of structures that can form part of a semiconductor structure according to the present disclosure. In embodiments, the semiconductor structure may comprise only the structure of the confined space on the left. In other embodiments, the semiconductor structure may comprise only the structure of the confined space on the right.

Figure 2:
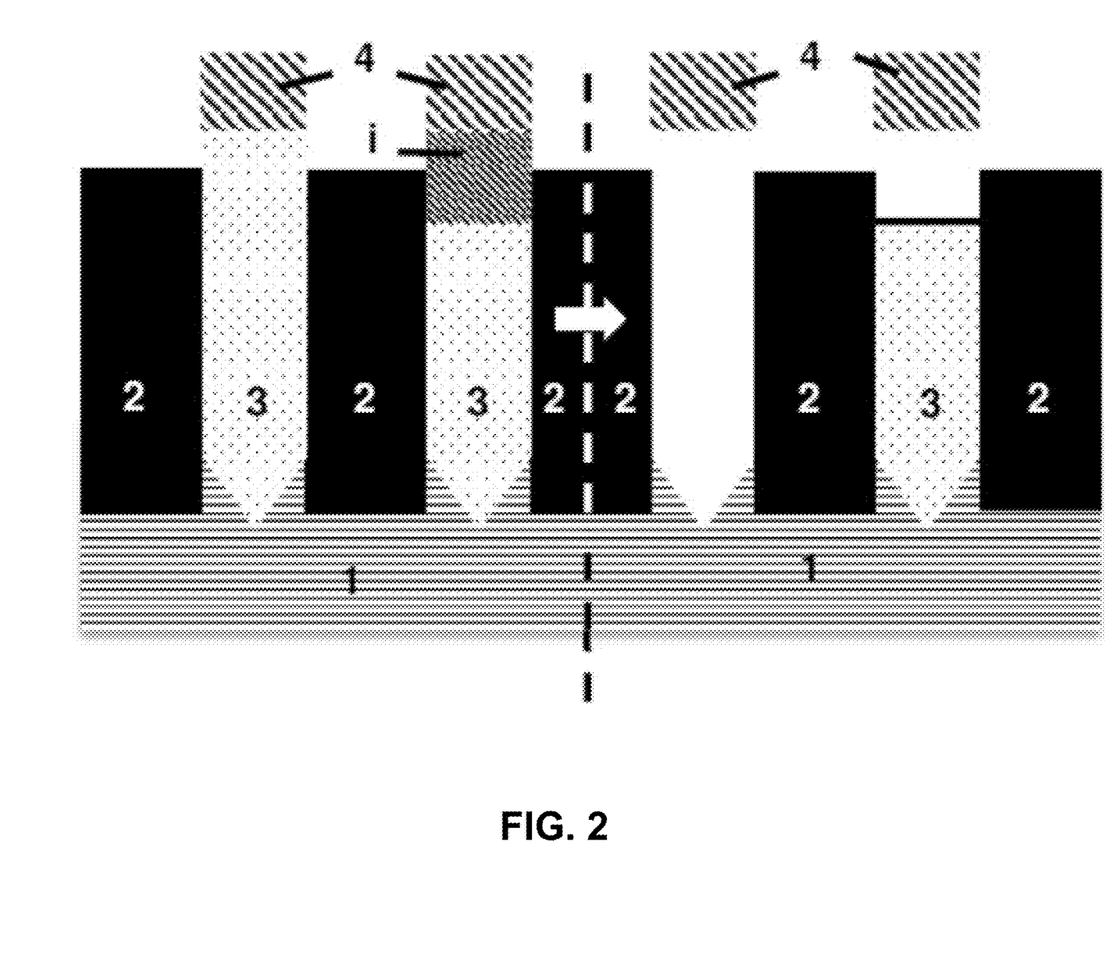
FIG. 2 is a vertical cross-section of a schematic representation of a semiconductor structure where a group IV monocrystalline structure is released by etching away at least part of the buffer layer, according to an exemplary embodiment.

FIG. 2 illustrates an embodiment of the present disclosure. The figure has two parts delimited by the vertical dashed line. The left part of the figure is the initial state of the structure (before etching of the buffer layer (3)). The right part of the structure is the state of the structure after etching of the buffer layer (3). The initial state of the structure is as shown in FIG. 1. In the structure resulting from the etching, the buffer layer (3) is removed (left) or the intermediate layer (i) is removed (right), thereby freeing the group IV semiconductor structures (4).

Figure 3:
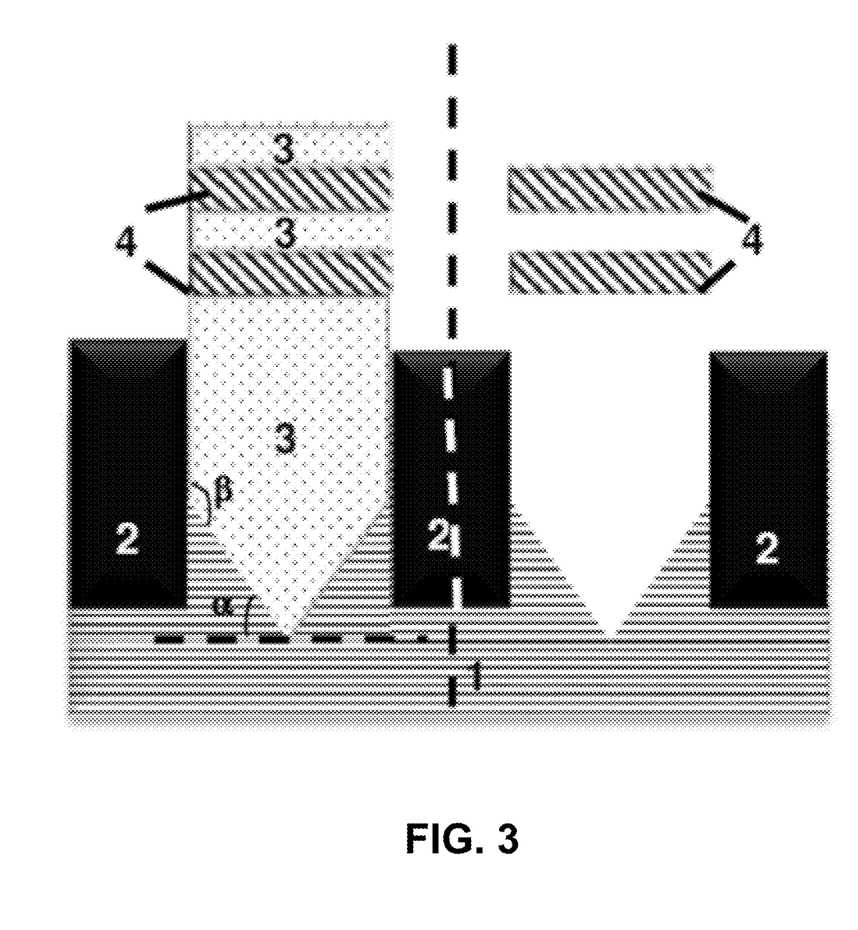
FIG. 3 is a vertical cross-section of a schematic representation of a semiconductor structure where a plurality of group IV monocrystalline structures is released by etching away the buffer layer, according to an exemplary embodiment.

FIG. 3 illustrates an embodiment of the present disclosure. The figure has two parts delimited by the vertical dashed line. The left part of the figure is the initial state of the structure (before etching of the buffer layers (3)). The right part of the structure is the state of the structure after etching of the buffer layers (3). On the left part of the figure, the initial state of a structure is shown where the buffer layers (3) are present. On the right side of the figure, the state of the structure is shown after etching of the buffer layers (3), thereby freeing nanosheets (4).

Figure 4:
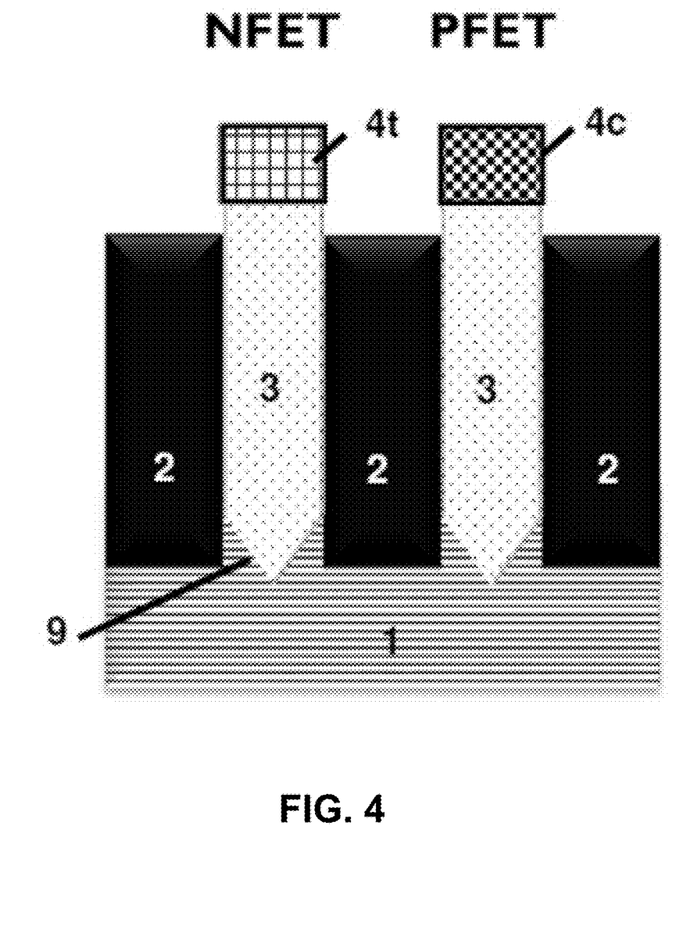
FIG. 4 is a vertical cross-section of a schematic representation of a semiconductor structure where two group IV monocrystalline semiconductor structures of opposite strain type share a same material for their respective buffer layers, according to an exemplary embodiment.

FIG. 4 shows a semiconductor structure illustrating an embodiment of the present disclosure. On the bottom of FIG. 4, a monocrystalline substrate (1) is shown.

On the left side of the semiconductor structure, a first confined space defined by a bottom surface belonging to the top surface of the monocrystalline substrate (1) and by non-crystalline sidewalls (2) is arranged on the substrate (1). The base of the confined space is optionally and as shown here not a flat surface of the substrate (1) but is carved in the substrate (1) so as to form a trench formed of two surfaces at an angle with the non-crystalline sidewalls (2), running along the length of the confined space, and meeting in a line inter-distant to both sidewalls (2). The confined space may for instance be a trench and the view of FIG. 1 may be a cross-section perpendicular to the longitudinal extent of that trench. A buffer layer (3) is depicted within the confined space. On top of the buffer layer a group IV monocrystalline structure (4t) with tensile strain is present. The structure can for instance be a nanowire.

On the right side of the semiconductor structure, a second confined space defined by a bottom surface belonging to the same top surface of the monocrystalline substrate (1) and by non-crystalline sidewalls (2) is arranged on the substrate (1). The base of the confined space is optionally and as depicted here not a flat surface of the substrate (1) but is carved in the substrate (1) so as to form a trench formed of two surfaces at an angle with the non-crystalline sidewalls (2), running along the length of the confined space, and meeting in a line inter-distant to both sidewalls (2). The confined space may for instance be a trench and the view of FIG. 1 may be a cross-section perpendicular to the longitudinal extent of that trench. A buffer layer (3) made of the same material as the buffer layer (3) present on the left side of the structure is depicted within the confined space. On top of the buffer layer (3) a group IV monocrystalline structure (4c) with compressive strain is present. The structure can for instance be a nanowire.

Figure 5:
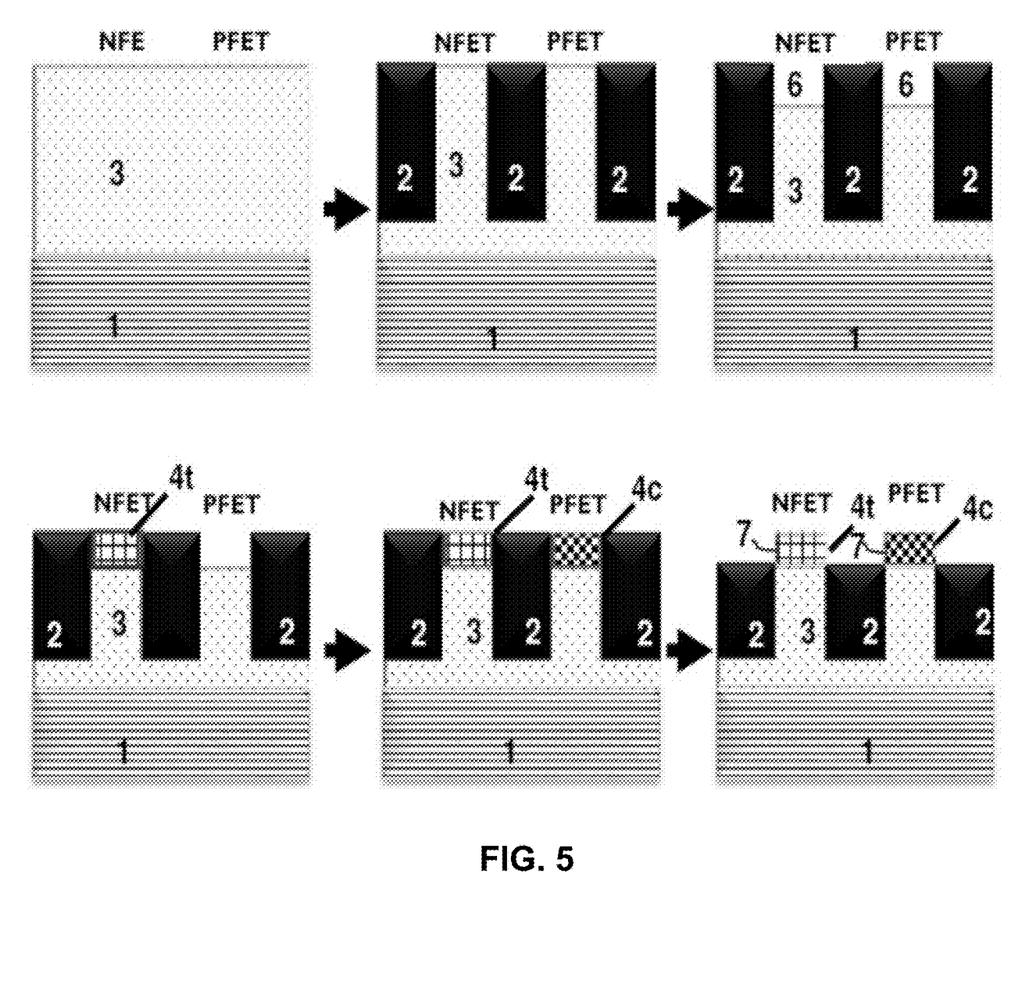
FIG. 5 and FIG. 6 are schemes showing alternative examples for the fabrication of semiconductor structures where two group IV monocrystalline semiconductor structures of opposite strain type (compressive vs tensile) share a same buffer layer, according to exemplary embodiments.

FIG. 5 shows an embodiment for the forming of a semiconductor structure comprising a compressively strained group IV monocrystalline structure (4c) and a tensile strained group IV monocrystalline structure (4t)

sharing a same buffer layer (3), the method may include: a1. epitaxially growing a III-V or II-VI buffer layer (3) on a monocrystalline substrate (1) and within a space confined by non-crystalline sidewalls (optional and not shown), the space if present having a width of from 1 to 10 microns, wherein the material forming the surface of the III-V or II-VI buffer layer (3) facing away from the monocrystalline substrate (1) has a first relaxed lattice constant. The method may also include a2. etching at least three parallel trenches in the buffer layer (3). The method may further include a3. filling the trenches with a non-crystalline material (2) thereby forming at least three parallel non-crystalline walls (2). The method may yet further include a4. optionally removing any of the non-crystalline material (2) deposited in step a3 that is not in a trench (e.g. using a technique such as chemical-mechanical planarization). The method may also include a5. forming at least a first (6a) and a second cavity (6b) by recessing the buffer layer (3) present between the parallel non-crystalline sidewalls (2) on a depth corresponding to the height of the group IV semiconductor structure (4) to be grown, each of the cavities (6a, 6b) being delimited by a pair of the parallel non-crystalline sidewalls (2) and a buffer bottom (3). The method may also include b. annealing the buffer layer (3) at any time during step a1 and/or after step a1 and before step d1. The method may also include d1. epitaxially growing on the buffer bottom (3) and within the first cavity (6a) at least one group IV monocrystalline structure (4t) made of a material having a relaxed lattice constant higher than the first relaxed lattice constant. The method may also include d2. epitaxially growing on the buffer bottom (3) and within the second cavity (6b) at least one group IV monocrystalline structure (4c) made of a material having a relaxed lattice constant lower than the first relaxed lattice constant. The method may also include d3. Exposing the sidewalls (7) of the group IV monocrystalline structures (4t, 4c) by recessing the non-crystalline sidewalls (2).

Figure 6:
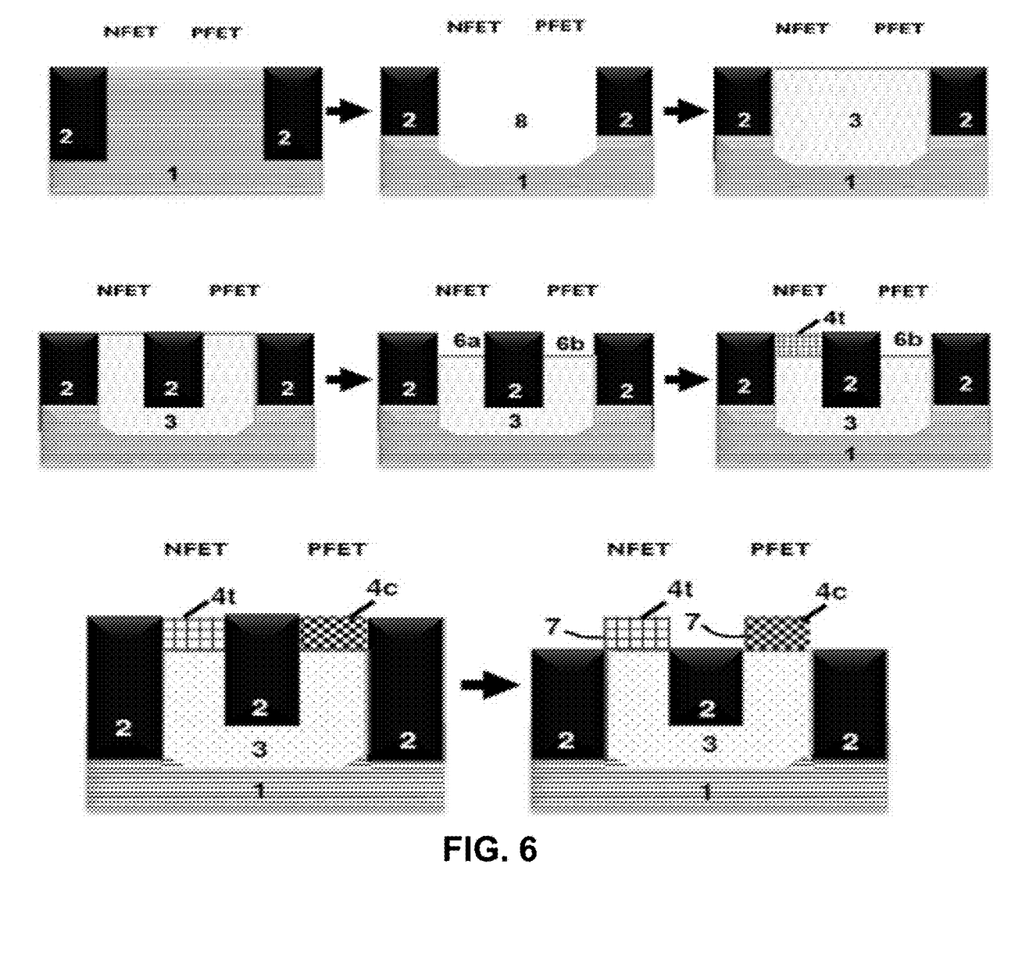

FIG. 6 shows an embodiment for the forming of a semiconductor structure comprising a compressively strained group IV monocrystalline structure (4c) and a tensile strained group IV monocrystalline structure (4t) sharing a same buffer layer (3), the method may comprise the following step.

The structure on the left in the first row of FIG. 6 may be obtained as follow: p1. providing a substrate (1), p2. etching two parallel trenches in the substrate (1), p3. filling the trenches with a non-crystalline material (2) thereby forming two parallel non-crystalline sidewalls (2).

The structure in the middle of the first row of FIG. 6 may be obtained by etching away the substrate material (1) present between both non-crystalline sidewalls (2), thereby forming a space (8) confined by non-crystalline sidewalls (2).

The structure on the right of the first row of FIG. 6 may be obtained by filling the space (8) with a III-V or II-VI buffer material (3) by epitaxially growing a III-V or II-VI buffer layer (3) on the monocrystalline substrate (1) within the space (8) confined by a first and a second parallel non-crystalline sidewalls (2), the space (8) having for instance a width of from 1 to 10 microns, wherein the material forming the surface of the III-V or II-VI buffer layer (3) facing away from the monocrystalline substrate (1) has a first relaxed lattice constant.

The structure on the left of the second row of FIG. 6 is obtained by a2. etching at least one trench in the buffer layer (3) between the first and the second non-crystalline sidewalls (2) and parallel therewith, a3. filling the at least one trench with a non-crystalline material (2) thereby forming at least a further non-crystalline sidewall (2), a4. optionally removing any of the non-crystalline material (2) deposited in step a3 that is not in a trench (e.g. using a technique such as chemical-mechanical planarization).

The structure in the middle of the middle row of FIG. 6 is obtained by a5. forming at least a first (6a) and a second (6b) cavity by recessing the buffer layer (3) present between the parallel non-crystalline sidewalls (2) on a depth corresponding to the height of the group IV semiconductor structure (4) to be grown, each of the cavity (6a, 6b) being delimited by a pair of the parallel non-crystalline sidewalls (2) and a buffer bottom (3).

The buffer layer is annealed at any step after the provision of the buffer layer (3) and before step d1.

The structure on the right of the middle row of FIG. 6 is obtained by d1. epitaxially growing on the buffer bottom (3) and within the first cavity (6a) at least one group IV monocrystalline structure (4t) made of a material having a relaxed lattice constant higher than the first relaxed lattice constant.

The structure on the left of the bottom row of FIG. 6 is obtained by d2. epitaxially growing on the buffer bottom (3) and within the second cavity (6b) at least one group IV monocrystalline structure (4c) made of a material having a relaxed lattice constant lower than the first relaxed lattice constant.

The structure on the right of the lower row of FIG. 6 is obtained by d3. exposing the sidewalls (7) of the group IV monocrystalline structures (4) by recessing the non-crystalline sidewalls (2).

Other arrangements for accomplishing the objectives of the embodying the disclosure will be obvious for those skilled in the art.

It is to be understood that although example embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method for forming a semiconductor structure comprising:
    epitaxially growing, on a monocrystalline substrate, a first buffer layer from one of: a III-V buffer layer or a II-VI buffer layer, wherein the first buffer layer is grown within a space confined by non-crystalline sidewalls, wherein the space has a width smaller than 10 microns, and wherein the material forming the surface of the first buffer layer facing away from the monocrystalline substrate has a first relaxed lattice constant;
    epitaxially growing on the first buffer layer a first at least one group IV monocrystalline structure comprising a material having a second relaxed lattice constant different from the first relaxed lattice constant; and
    removing the first buffer layer from the first at least one group IV monocrystalline structure by selectively etching away at least part of the first buffer layer on the first at least one group IV monocrystalline structure.

2. The method of claim 1, further comprising:
annealing the first buffer layer.

3. The method of claim 1, further comprising:
epitaxially growing, on the first buffer layer, a monocrystalline interlayer from one of: a III-V monocrystalline interlayer or a II-VI monocrystalline interlayer, wherein the interlayer is made of a material having a third relaxed lattice constant equal to the second relaxed lattice constant, and wherein the interlayer is thinner than a critical thickness at which a strain induced by the difference between the first and the third relaxed lattice constant is relaxed.

4. The method of claim 3, wherein epitaxially growing on the first buffer layer the first at least one group IV monocrystalline structure comprises growing the first at least one group IV monocrystalline structure on the monocrystalline interlayer.

5. The method of claim 4, further comprising:
removing the interlayer from the first at least one group IV monocrystalline structure by selectively etching away at least part of the interlayer layer on the first at least one group IV monocrystalline structure.

6. The method of claim 1, wherein the first at least one group IV monocrystalline structure has two extremities along its longitudinal direction, and wherein the first at least one group IV monocrystalline structure is secured to the substrate by having the two extremities attached to the substrate by a material that is not etched.

7. The method of claim 6, wherein one extremity is attached to the substrate via attachment to a source contact, and wherein another extremity is attached to the substrate via attachment to a drain contact.

8. The method of claim 1, wherein the first relaxed lattice constant is smaller than the second relaxed lattice constant, thereby forming a compressively strained group IV monocrystalline structure.

9. The method of claim 1, wherein the material having a second relaxed lattice constant is a semiconductor of a general formula $Si_{1-x}Ge_x$, and wherein x is from 0 to 0.4.

10. The method of claim 9, further comprising:
epitaxially growing Si on the $Si_{1-x}Ge_x$ material, wherein x is from 0.01 to 0.4.

11. The method of claim 10, wherein the thickness of the $Si_{1-x}Ge_x$ material is from 5 to 30 nm.

12. The method of claim 1, wherein the first at least one group IV monocrystalline structure has the shape of one of: a nanowire or a nanosheet.

13. The method of claim 1, wherein the semiconductor structure is a field effect transistor, wherein the first at least one group IV monocrystalline structure forms a channel, and wherein the method further comprises providing the field effect transistor with a source, a drain, and a gate structure.

14. The method of claim 1, wherein the lattice mismatch of the material having the first relaxed lattice constant with the material having the second relaxed lattice constant is from −0.1% to −3%.

15. The method of claim 1, wherein the lattice mismatch of the material having the first relaxed lattice constant with the material having the second relaxed lattice constant is from 0.1% to 3%.

16. The method of claim 1, further comprising:
epitaxially growing a second buffer layer from one of: a III-V buffer layer or a II-VI buffer layer, wherein the second buffer layer is made of a material having a fourth relaxed lattice constant;
epitaxially growing on the second buffer layer a second at least one group IV monocrystalline structure made of a material having a fifth relaxed lattice constant; and
removing the second buffer layer from the second at least one group IV monocrystalline structure by selectively etching away at least the part of the second buffer layer present on the second at least one group IV monocrystalline structure.

17. The method of claim 1, wherein the monocrystalline substrate has facets defined therein prior to epitaxial growth.

18. The method claim 1, wherein epitaxially growing on the first buffer layer the first at least one group IV monocrystalline structure comprises epitaxially growing on the first buffer layer: (i) a first monocrystalline structure made of a group IV material having a higher relaxed lattice constant than the first lattice constant, and (ii) a second monocrystalline structure made of a group IV material having a lower relaxed lattice constant than the first lattice constant.

\* \* \* \* \*